US011019110B2

(12) United States Patent
Brown et al.

(10) Patent No.: US 11,019,110 B2
(45) Date of Patent: May 25, 2021

(54) ACCESS CONTROL TO A VOICE SERVICE BY A WIRELESS ACCESS POINT

(71) Applicant: British Telecommunications Public Limited Company, London (GB)

(72) Inventors: Ruth Brown, London (GB); Alistair Gomez, London (GB)

(73) Assignee: British Telecommunications Public Limited Company, London (GB)

( * ) Notice: Subject to any disclaimer, the term of this patent is extended or adjusted under 35 U.S.C. 154(b) by 89 days.

(21) Appl. No.: 16/311,826

(22) PCT Filed: Jun. 28, 2017

(86) PCT No.: PCT/EP2017/065977
§ 371 (c)(1),
(2) Date: Dec. 20, 2018

(87) PCT Pub. No.: WO2018/002130
PCT Pub. Date: Jan. 4, 2018

(65) Prior Publication Data
US 2019/0230132 A1 Jul. 25, 2019

(30) Foreign Application Priority Data
Jun. 30, 2016 (EP) ..................................... 16177397

(51) Int. Cl.
*H04L 29/06* (2006.01)
*H03F 3/195* (2006.01)
(Continued)

(52) U.S. Cl.
CPC ....... *H04L 65/1036* (2013.01); *H03F 1/0288* (2013.01); *H03F 1/30* (2013.01);
(Continued)

(58) Field of Classification Search
CPC ............. H04L 65/1036; H04L 65/1016; H04L 65/1069; H04L 65/80; H04W 4/16;
(Continued)

(56) References Cited

U.S. PATENT DOCUMENTS

| 10,015,686 | B2 | 7/2018 | Townend | |
| 2006/0111112 | A1* | 5/2006 | Maveddat | ............. H04W 36/14 |
| | | | | 455/439 |

(Continued)

FOREIGN PATENT DOCUMENTS

| WO | WO 2004/102919 A1 | 11/2004 |
| WO | WO 2015/150745 A1 | 10/2015 |

(Continued)

OTHER PUBLICATIONS

International Search Report and Written Opinion for corresponding International Application No. PCT/EP2017/065977 dated Sep. 6, 2017; 10 pages.

*Primary Examiner* — Jackie Zuniga Abad
(74) *Attorney, Agent, or Firm* — Patterson Thuente Pedersen, P.A.

(57) ABSTRACT

A wireless access point is configured to regularly monitor the status of WLAN, WAN and ePDG data links to determine whether the current connections are sufficient to support VoWiFI services. When a device connects to the WLAN of the hub and attempts to switch from its VoLTE service to VoWiFi via the hub, the hub is configured to determine whether the current conditions can satisfy a VoWiFi connection. If the VoWiFi service can support the connection, the request is routed to the ePDG associated with the mobile device's subscriber LTE network. However, if the current conditions cannot satisfactorily support a VoWiFi connection such that incoming calls may be missed or the quality of active calls would not be clear, then the hub is configured (Continued)

to block the request so that the client device will time out and remain connected to VoLTE.

7 Claims, 6 Drawing Sheets

(51) Int. Cl.
| | |
|---|---|
| *H03F 1/30* | (2006.01) |
| *H03F 1/56* | (2006.01) |
| *H03F 1/02* | (2006.01) |
| *H03F 3/213* | (2006.01) |
| *H04W 4/16* | (2009.01) |
| *H04W 8/26* | (2009.01) |
| *H04W 24/08* | (2009.01) |
| *H04W 88/16* | (2009.01) |
| *H04W 84/12* | (2009.01) |

(52) U.S. Cl.
CPC ............ *H03F 1/565* (2013.01); *H03F 3/195* (2013.01); *H03F 3/213* (2013.01); *H04L 65/1016* (2013.01); *H04L 65/1069* (2013.01); *H04L 65/80* (2013.01); *H04W 4/16* (2013.01); *H04W 8/26* (2013.01); *H04W 24/08* (2013.01); *H04W 88/16* (2013.01); *H03F 2200/211* (2013.01); *H03F 2200/213* (2013.01); *H03F 2200/216* (2013.01); *H03F 2200/318* (2013.01); *H03F 2200/387* (2013.01); *H03F 2200/391* (2013.01); *H03F 2200/408* (2013.01); *H03F 2200/447* (2013.01); *H03F 2200/468* (2013.01); *H03F 2200/534* (2013.01); *H03F 2200/541* (2013.01); *H04W 84/12* (2013.01)

(58) Field of Classification Search
CPC ....... H04W 8/26; H04W 24/08; H04W 88/16; H04W 84/12
See application file for complete search history.

(56) References Cited

U.S. PATENT DOCUMENTS

| | | | |
|---|---|---|---|
| 2014/0313888 A1* | 10/2014 | Linkola | ................. H04W 36/22 370/230 |
| 2016/0174110 A1 | 6/2016 | Sharma et al. | |
| 2017/0111813 A1 | 4/2017 | Ringland | |
| 2017/0118091 A1 | 4/2017 | Ringland | |
| 2019/0037339 A1* | 1/2019 | Liu | ..................... H04L 12/1407 |

FOREIGN PATENT DOCUMENTS

| | | |
|---|---|---|
| WO | WO2017114932 | 7/2017 |
| WO | WO2017167694 | 10/2017 |
| WO | WO2017167701 | 10/2017 |
| WO | WO2018/178241 | 10/2018 |
| WO | WO2018/178293 | 10/2018 |
| WO | WO2018/178294 | 10/2018 |
| WO | WO 2018/234037 | 12/2018 |
| WO | WO 2018/234038 | 12/2018 |

* cited by examiner

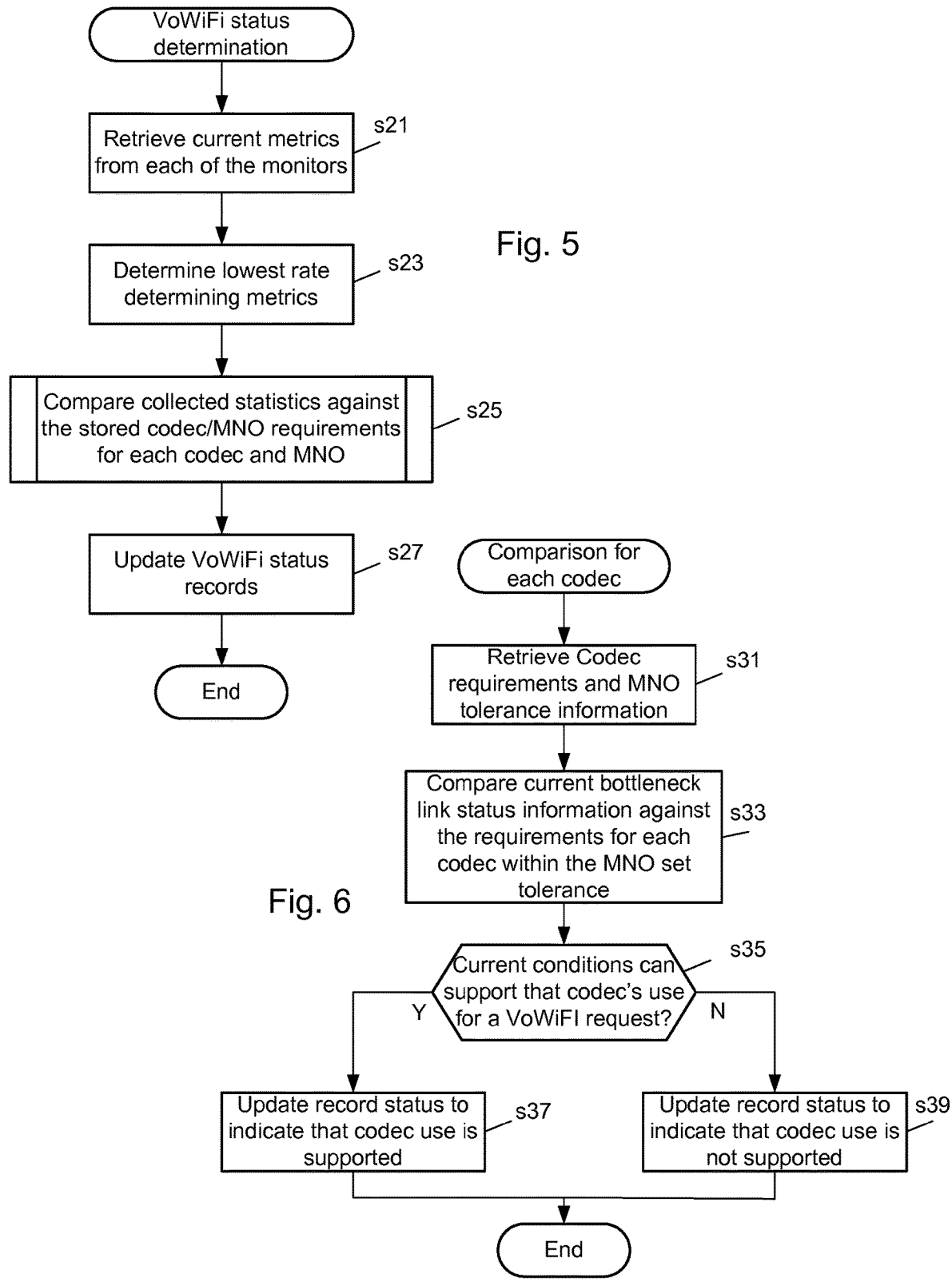

ACCESS CONTROL TO A VOICE SERVICE BY A WIRELESS ACCESS POINT

CROSS-REFERENCE TO RELATED APPLICATION

The present application is a National Phase entry of PCT Application No. PCT/EP2017/065977, filed Jun. 28, 2017, which claims priority from EP Patent Application No. 16177397.3, filed Jun. 30, 2016 each of which is hereby fully incorporated herein by reference.

TECHNICAL FIELD

The present disclosure relates to managing wireless communication services and in particular to a method and apparatus for controlling device connection to a Voice over Wi-Fi (VoWiFi) service.

BACKGROUND

Cellular data networks provide data connectivity to mobile devices having cellular network interfaces. The network is formed of a network core for handling control plane functions and data packet routing, and a radio access network (RAN) of macrocell base stations located throughout the coverage area of the mobile network for wireless communication with subscriber mobile devices. An example of a cellular network architecture is Long Term Evolution (LTE). Unlike previous generation second generation (2G) and third generation (3G) cellular networks which offer packet switched data services on top of a circuit switched voice platform, LTE is an all-packet switched data network architecture that does not support the traditional voice calling platform.

Wireless local area networks (WLANs) operating in accordance with the IEEE 802.11 family of standards (commonly referred to as Wi-Fi) are common in many user locations and provide data connectivity over a short geographic range. Typically the wireless local area network is generated and maintained by a wireless access point (AP) which acts as a packet routing interface between devices connected to the WLAN (e.g. smartphones, tablets) and local devices connected via a wired interface (televisions, network attached storage). The wireless access point serves local devices and will typically be co-located, or integrated with an external network interface such as a modem for providing a backhaul link to external networks such as the Internet via an Internet Service Provider's core network. Example backhaul technologies include Digital Subscriber Line (xDSL) copper/fiber and cable based on the Data over Cable Service Interface Specifications (DOC SIS) architecture.

Such a combined AP, packet routing and modem device will be referred to as a "hub" throughout the description.

VoLTE/VoWiFi

Voice over LTE (VoLTE) is a voice service running over LTE uses optimized headers and priority marking to provide a voice service using the packet switched network with an aim to reducing/replacing legacy voice networks.

Due to the prevalence of WLANs in many areas, the Voice over Wi-Fi (VoWiFi) or Wi-Fi Calling service has also been deployed by several network operators. In VoWiFi, the WLAN is regarded as a non-3GPP (3rd Generation Partnership Project) access network base station to the LTE network so that voice calls are made and received using the standard telephony software and packet data is tunneled to and from the cellular network core. VoWiFi therefore appear to extend the cellular network coverage to indoor locations and allows handover to a normal VoLTE service when the mobile device moves to an outdoor location.

Mobile devices such as smartphones will therefore have both a cellular network interface and a WLAN interface for data connectivity. WLANs offer an unmetered service and so the mobile device is configured to prefer the WLAN interface for all data connectivity when both WLAN and cellular access is available.

With the conventional processing, the mobile device is only concerned with the quality of the WLAN signal to the hub. As long as the WLAN signal strength is above a signal strength threshold, the mobile device will connect to the WLAN and register to services carried over a WLAN, including VoWiFi, even if there is no onward connection the external networks such as the Internet. This can cause confusion for users because the phone displays a strong WLAN connection (typically via an icon with various bars to indicate signal strength) but the data services on the mobile device do not connect to their host servers.

SUMMARY

The present disclosure addresses the above problems.

In one aspect, an embodiment of the present disclosure provides a method of operating a wireless network access point to control access for at least one mobile device to a voice service provided by a cellular network and accessible via the wireless access point, the wireless access point having a wireless network interface for communication with the at least one mobile device via a wireless link and a wide area network interface for communication with a wide area network via a wide area network link, and the at least one mobile device having a non-cellular wireless network interface for communication with the wireless network access point and the voice service via a cellular gateway located at the logical edge of the cellular network, and also having a cellular network interface for communication with the voice service via the cellular network, the method comprising: determining whether current network conditions on at least the wireless link and the wide area network interface can support the voice service requirements by: determining performance metrics for the non-cellular wireless network and performance metrics for the link to the wide area network; and comparing a subset of the determined performance metrics against a set of thresholds required for the voice service; receiving a request from the mobile device to the cellular gateway for the voice service; and if the determination is that the voice service can be supported by the current network conditions, allowing a connection to the voice service to be established by the mobile device; if the determination is that the voice service cannot be supported by the current network conditions, blocking the voice service request.

In a further aspect, an embodiment of the present disclosure provides an apparatus for controlling access of at least one mobile device to a voice service located in a cellular network and accessible via the wireless access point, the at least one mobile device having a wireless network interface for communication with the wireless network access point and the voice service via a cellular gateway device located at the logical edge of the cellular network, and also having a cellular network interface for communication with the voice service via the cellular network, the apparatus comprising: a wireless network interface for communication with the at least one mobile device via a wireless link; a wide area network interface for communication with a wide area network; means for determining whether current network conditions for at least the wireless link and the wide area network interface can support the voice service requirements by: determining performance metrics for the non-cellular wireless network and performance metrics for the link to the wide area network; and comparing a subset of the determined performance metrics against a set of thresholds required for the voice service; means for receiving a request from the mobile device to the cellular gateway for the voice service; and processing means operable after said determining means to: allow a connection to the voice service to be established by the mobile device if the determination is that the voice service can be supported by the current network conditions; and block the voice service request if the determination is that the voice service cannot be supported by the current network conditions.

In a further aspect, an embodiment of the present disclosure provides computer program containing processor executable instructions for causing a processor to carry out the method.

BRIEF DESCRIPTION OF THE DRAWINGS

Embodiments of the present disclosure will now be described with the aid of the accompanying Figures, in which:

FIG. 5 is a flowchart showing the operation of a VoWiFi service monitor to determine VoWiFi availability in the first embodiment.

FIG. 6 is a flowchart showing the operation of the VoWiFi service monitor in more detail to determine codec and MNO requirements.

DESCRIPTION

System Overview

Figure 1:
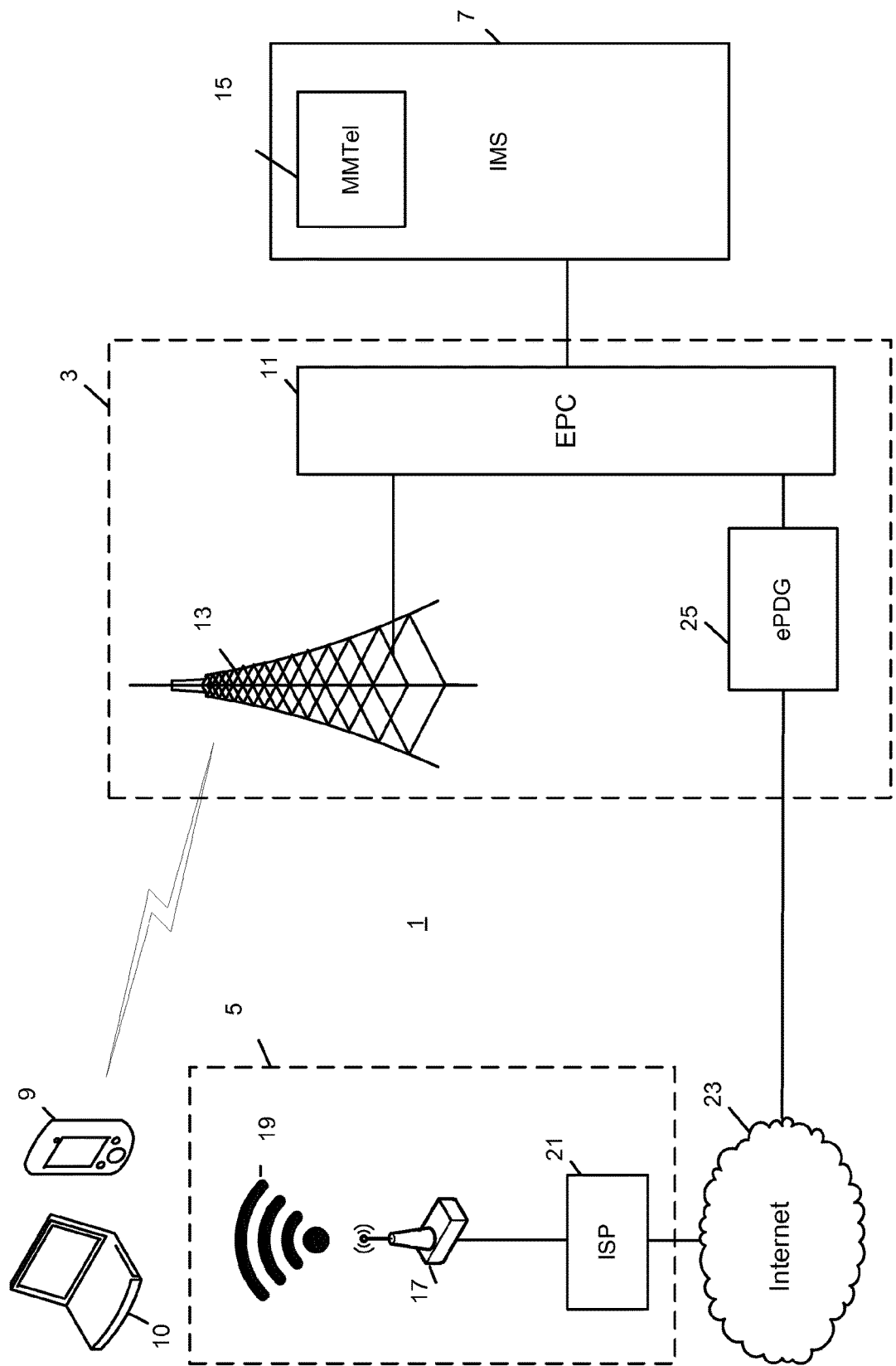
FIG. 1 schematically shows an overview of a telecommunications network of the first embodiment.

FIG. 1 shows an overview of the main components in a telecommunications communication system 1 according to the first embodiment. The system 1 has several functional subsystems:
 a Long Term Evolution (LTE) cellular network 3 infrastructure;
 non-cellular network infrastructure 5 including a local network and Internet Service Provider (ISP) architecture; and
 an IP Multimedia Subsystem (IMS) 7.

The LTE cellular network 3 provides cellular network client devices which are subscribers of that network 3, known as User Entities (UE) such as mobile telephones 9, with data and voice services. The LTE cellular network 3 includes a network core 11 and a radio access network formed of eNodeBs 13 for connecting services and resources in the network core 11 to the UEs 9. The network core 11 contains the standard control functions such as a Multimedia Mobility Entity (MME) (not shown), a Home Subscriber Server (HSS) (not shown), and a Policy Configuration Rules Function (PCRF) (not shown). For routing data packets to remote resources, there are a number of Serving Gateways (SGW) (not shown) and Packet Gateways (PGW) (not shown).

The IMS 7 is an IP data network which provides a unified service architecture for all networks. Multiple services can be provided on a single control/service layer even though the access networks may be different. The IMS 7 therefore reduces the need for duplication in data services/applications. The VoLTE and VoWiFi voice calling services are hosted in an application server 15 within the IMS 7 which in this embodiment is provided by a service known as the Multimedia Telephony Service (MMTel).

The non-cellular network infrastructure 5 includes a wireless access point/modem router device 17, hereinafter referred to as a hub, located in a user premises, such as their home, generating a wireless local area network (WLAN) 19 in accordance with the IEEE 802.11 family of standards to allow communication with UEs 9 and also WLAN only devices such as a computer 10. For external network access, the hub 17 communicates with an Internet Service Provider (ISP) 21 which routes data via a wide area network such as the Internet 23 to external servers and users.

Due to the ability of the LTE cellular network 3 to use non-cellular access for applications such as Wi-Fi-Offload, the LTE cellular network 3 also includes an Evolved Packet Data Gateway (ePDG) 25 which acts as a termination point for secure data tunnels (IPSec) tunnels with the UE over non-trusted 3GPP IP systems. This allows data from UEs 9 located on non-cellular access networks 5 into the EPC network core 11 for processing within the LTE cellular network 3 and IMS 7 network.

For ease of explanation, the first embodiment will be described with regard to a single UE 9 which is configured as a subscriber of the LTE network 3. When the UE is connected to the hub 17 via the WLAN 19, any data traffic which is related to the LTE network is configured to be routed via the ePDG 25.

The UE 9 has both WLAN and LTE radio interfaces for accessing the non-cellular network infrastructure and the LTE cellular network respectively and the UE 9 supports VoLTE, VoWiFi and Circuit Switched Fall back (CSFB) voice calls. To highlight the difference between UEs 9 and other connected WLAN devices 10, the computer 10 only has a WLAN interface and therefore can only access the WLAN 19 of the hub 17 but not the cellular network 3 since it does not have an interface capable of sending and receiving LTE or other cellular network signals.

Behavior of UE for Activating Wi-Fi and LTE Interfaces

As mentioned above, the UE 9 has both WLAN and LTE interfaces and is capable of both VoLTE and VoWiFi call handling. Since an eNodeB 13 of the LTE network has a larger geographical coverage range than a WLAN 19, in general the UE will be connected to the LTE network 3 and will use VoLTE.

However, when the UE is within range of a WLAN 19 such as shown in FIG. 1, there is overlap in the connectivity ranges, and the UE 9 could connect to remote data services using either its cellular interface or the WLAN interface. In general, the default policy is that a WLAN connection is preferred. So when a UE is connected to the LTE network 3 and it detects a known WLAN 19, the UE 9 will try to use the WLAN 19.

Therefore upon detection of a known WLAN 19, the UE 9 will enable its WLAN interface and disable its cellular interface causing any existing services to also be disconnected. This change is generally transparent to the user of the UE as it has little impact to the operation of services such as file transfers and web browsing. However, the general UE policy of preferring WLANs to cellular data interfaces can have an impact on the Quality of Experience for users of voice services using VoWiFi instead of VoLTE.

In particular, once the UE 9 has connected (using the standard association and authentication routines) to the WLAN, the voice client in the UE 9 will attempt to connect to the VoWiFi service.

However, if the current service conditions of the WLAN or connection to the ePDG 25 are not able to support the specific service requirements of the VoWiFi connection, then even though the UE has connected to VoWiFi, the connection will not be able to support a successful active session/call and therefore the user will not be able to make and receive voice calls using VoWiFi.

In the embodiment, the hub 17 is aware that some connected devices can use VoWiFi and so it uses information about the status of the WLAN capacity and the status of the connection to the ePDG, and therefore the availability of the VoWiFi service, in order to control access by connected devices to VoWiFi. In particular, if it is determined that VoWiFi cannot be supported, the hub will deny access to the VoWiFi service so that the device remains connected to VoLTE.

Hub

The components of the hub will now be described with reference to FIG. 2.

Figure 2:
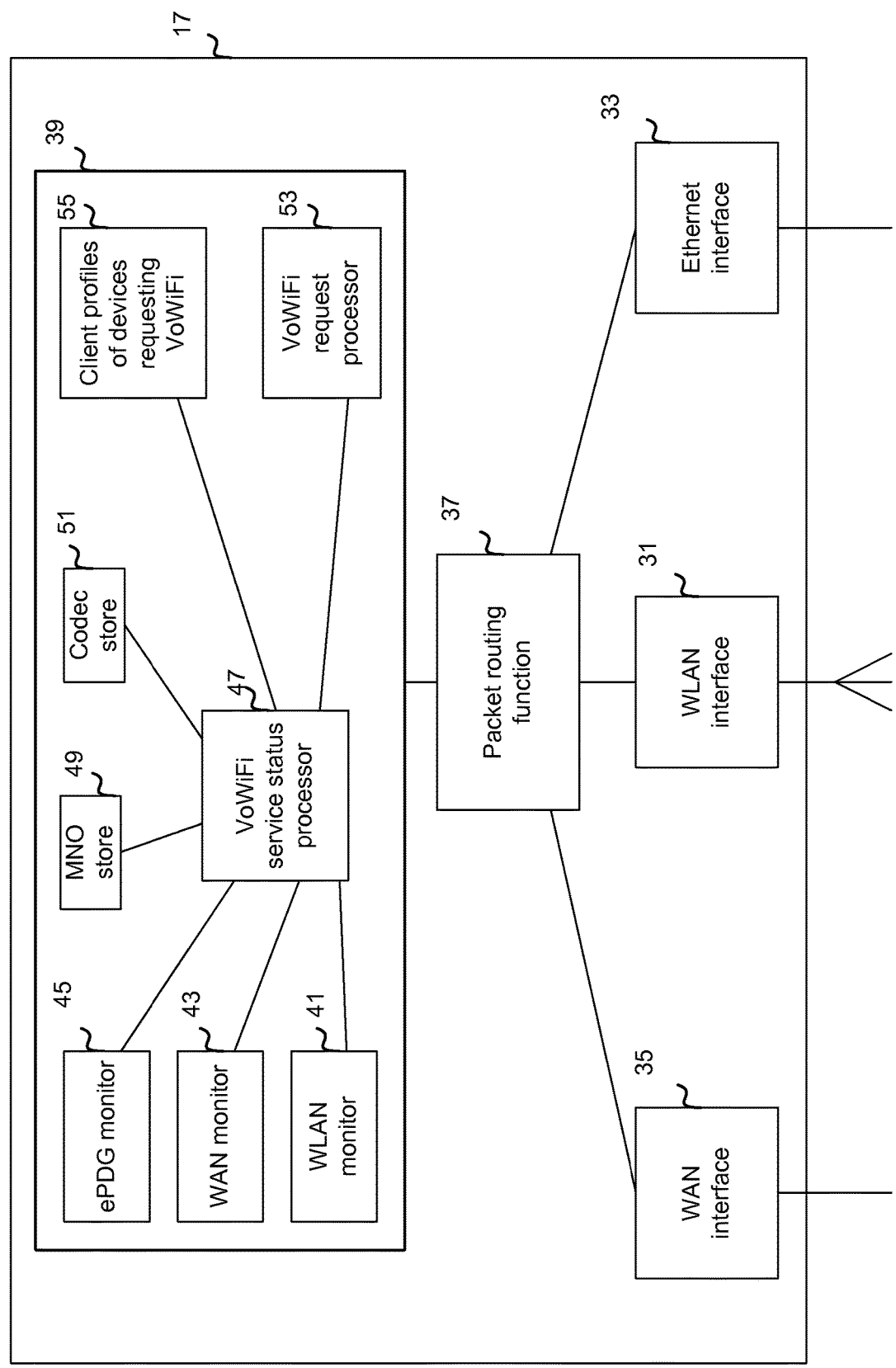
FIG. 2 schematically shows the functional components of a hub device in accordance with the first embodiment.

FIG. 2 shows the internal components of the hub 17 in more detail. The hub 17 contains a number of network interfaces for communication with various types of network device. For local devices, there is a Wireless Local Area Network (WLAN) interface 31 for communication with wireless devices using a wireless protocol such as the IEEE 802.11 family of wireless LAN standards known as Wi-Fi. In this embodiment, the WLAN interface 31 is compliant with the 802.11ac standard for WLAN operation. For wired LAN devices there is an Ethernet interface 33 in accordance with the IEEE 802.3 standards.

For connectivity to the Internet Service Provider (ISP), the hub 17 has a Wide Area Network (WAN) interface 35 which in this embodiment is a modem compliant with the Digital Subscriber Line (xDSL) family of standards such as Very High Speed DSL (VDSL) modem.

The hub 17 also contains a central processor and memory (not shown). The memory contains computer program code which, when executed by the processor, define a number of software functional units which are described below.

The hub 17 contains a packet routing function 37 which is responsible for managing the flow of data packets between the three interfaces 31, 33, 35. The packet routing function 37 processes the headers of incoming packets received on the three interfaces 31, 33, 35 and determines where to send the packets for onward delivery to the intended packet destination. The packet routing function 37 will also include functions such as Network Address Translation (NAT) for directing packets between the local interfaces 31, 33 and the WAN interface 35.

The hub 17 contains a VoWiFi monitor function 39 which is responsible for monitoring the status of the hub's local side WLAN and WAN connections, and also the status of the logical link to the ePDG 25. These statistics and metrics are used to determine whether the current conditions are suitable for supporting a VoWiFi service. The VoWiFi monitor function 39 is also configured to process requests for VoWiFi service from a UE 9 and either allow or deny the registration request in accordance with an assessment of the VoWiFi network requirements with regard to the current conditions.

In this way, the hub 17 acts as an access controller to devices requesting VoWiFi and selectively allows access to VoWiFi in accordance with whether a VoWiFi session can be supported.

The VoWiFi monitor function 39 contains three main sections, a monitoring section, a status determination section and a request processor section.

VoWiFi Monitoring

The monitoring section has a WLAN status monitor 41, a WAN status monitor 43 and a VoWiFi service monitor 45.

The WLAN status monitor 41 is concerned with monitoring the performance of the wireless link to VoWiFi capable devices 9. It is linked to the WLAN interface and periodically measures the utilization of the WLAN which is an indicator of congestion which may affect the quality of VoWiFi service. In this embodiment, the number of connected devices, total throughput to all connected devices and latency are periodically measured.

The WAN status monitor 43 is concerned with the state of the physical DSL connection which affects the performance of all WAN bound network traffic, the WAN status monitor 43 is linked to the WAN interface and periodically measures a set of line statistics of the DSL line to the ISP 21.

An example of the DSL line statistics gathered is shown below.

VPI/VCI: 0/38
Type: PPPoA
Modulation: G.992.1 Annex A
Latency type: Interleaved
Noise margin (Down/Up): 11.6 dB/19.0 dB
Line attenuation (Down/Up): 61.2 dB/31.5 dB
Output power (Down/Up): 16.5 dBm/12.3 dBm
FEC Events (Down/Up): 38051/65
CRC Events (Down/Up): 526/97
Loss of Framing (Local/Remote): 0/0
Loss of Signal (Local/Remote): 0/0
Loss of Power (Local/Remote): 0/0
HEC Events (Down/Up): 1529/69
Error Seconds (Local/Remote): 8689/256 ePDG monitor

The ePDG monitor 45 is concerned with the health of the logical link to the ePDG 25. In this embodiment, it periodically measures throughput, latency and round trip delay.

Each of the above monitors sends any measured state information to a VoWiFi service status processor 47.

Link Status Determination

The monitoring section is concerned with gathering current statistics of the various links involved between a VoWiFi capable UE 9 and the ePDG 25 serving the UE's subscribed LTE cellular network 3.

The line status section is responsible for processing the gathered status data in order to make a determination of the health of the VoWiFi service. The line status section contains the VoWiFi service status processor 47, a Mobile Network Operator (MNO) store 49 and a codec store 51.

The codec store 51 contains information relating to a number of codecs that may be used in VoWiFi sessions. Examples of such "codecs" include Dolby™, AMR-WB and Silk™. Each codec will have different criteria in terms of minimum bandwidth maximum packet loss, maximum packet loss and maximum jitter.

An example of the contents of a codec store 51 are shown below.

TABLE 1

| Codec | Bandwidth kb/s | Max packet loss (%) | Max Latency | Max Jitter (ms) | Ready? |
|---|---|---|---|---|---|
| Dolby | 25 | 0.5 | 150 | 2 | |
| AMR-WB | 50 | 1 | 150 | 1 | |
| Silk | — | — | — | — | |
| Generic | 50 | 2 | 200 | 4 | |

Each row entry in the codec store relates to a different codec which can be used for VoWiFi. As shown above, each entry defines the threshold bandwidth, packet loss, latency and jitter that is required in order to support the minimum VoWiFi function.

The MNO store 49 contains information relating to the LTE cellular network providing the VoWiFi service, this includes the name of the LTE cellular network 3, the address of the associated ePDG 25 and also any specific requirements relating to the LTE network's ability to provide the VoWiFi service. For example the minimum quality of the data link in terms of bandwidth, latency and delay which must be present for a VoWiFi connection to be allowed on the LTE network 3. This set of criteria may vary at different times of the day.

In this embodiment, the MNO specific information is retrieved by the ISP 21 from the LTE network 3 and then directed to the hubs 17 via a management service such as TR-069 or similar method for ISP 21 to hub 17 communication.

An example of contents stored in the MNO store is shown below.

TABLE 2

| MNO requirements | | Time of day metric | | |
|---|---|---|---|---|
| Provider | Tolerance (%) | Time | Tolerance (%) | Ready |
| EE | 5 | Morning | 0 | |
| Vodafone | 5 | Afternoon | 10 | |
| Generic | 5 | — | — | — |

As shown in Table 2, although the embodiment has been described with respect to a single MNO/LTE network 3, the MNO store 49 can store data for more than one LTE network managed by different MNOs to cater for plural VoWiFi UEs 9 being subscribers to a number of different LTE networks 3.

Each MNO entry has an associated tolerance factor. This is a modifier to the thresholds defined for each codec which may be used by a LTE network for VoWiFi so that the VoWiFi connection may still be allowed even if the current conditions do not meet the minimum requirements. This would allow a VoWiFi connection to be established in the expectation that the current conditions will improve at a future point in time to satisfy the codec requirements when a VoWiFi call is made/received. For example, if the codec specifies that the minimum bandwidth is 50 kbps and the MNO entry for VoWiFi specifies a 10% tolerance, when the current link throughput conditions are between 45 kbps and 49 kbps the VoWiFi connections should still be allowed. However if the line conditions are less than 45 kbps then the VoWiFi service is deemed to be unavailable for the testing period.

The MNO entry also includes optional fields for defining different tolerances at different times of day, for example during expected quiet times the tolerance can be greater while in busy times the tolerance is lower.

The VoWiFi service status processor 47 periodically acquires the current line conditions from each of the WLAN monitor 41, WAN monitor 43 and ePDG monitor 45. The data from these monitors relates to the status of different segments of the connection between a UE 9 and the ePDG 25, namely the WLAN subsystem between the UE 9 and the hub 17, the DSL system between the hub 17 and the ISP 21 and the hub to the ePDG 25 (which includes the DSL link but also takes account of the link between the ISP and the ePDG via the wide area network). The slowest performing section will be the rate limiting determinant in whether VoWiFi can be supported. The VoWiFi service status monitor 47 is therefore configured to identify the lowest performance values from the set of collected data for later comparison against the codec and MNO requirements for VoWiFi set out in the codec store 51 and MNO store 49.

A number of scenarios where different sections can become the performance limiting section are set out below:

WLAN is Congested

In this scenario, there are a large number of devices connected to the WLAN, or a source of interference (neighboring WLANs or microwave) is causing the performance of the WLAN to deteriorate. In this case, the DSL link and ePDG link may indicate good link performance, however, due to the interference, the WLAN monitor values are much lower. In this case, the WLAN is likely to be the performance limiting section.

DSL Link Down or Congested

In this scenario, the WLAN is indicating good performance, however, the WAN monitor statistics indicate that the DSL line is either not functioning or is functioning at a lower performance than the WLAN. The ePDG monitor is directly affected by the performance of the WAN link and therefore the lowest of these values will be used in later calculations.

Logical Link to ePDG Congested

In this scenario, there are no problems with the WLAN or DSL link, however due to a problem in the link to the ePDG, for example a fault at the ePDG itself or an intermediary routing node on the Internet, the ePDG measurements are lower than the WLAN and WAN monitor values. Therefore the values collected by the ePDG monitor are used in the later calculations. Furthermore, the hub can differentiate this scenario from the earlier scenario because the DSL link statistics have not reduced.

Having determined the lowest current metric values of bandwidth, jitter, packet loss, delay etc., from the set of data collected from the monitors 41, 43, 45, the VoWiFi service status monitor 47 compares the observed conditions against each of the codec requirements as modified by the applicable MNO tolerance value in order to determine which VoWiFi services are supportable to clients. In this embodiment the test is carried out every 5 minutes to provide an up-to-date status of the VoWiFi conditions.

As shown in Table 1 and 2, the final column in each of the MNO store 49 and codec store 51 is used to store the result of each comparison. A data field for each MNO and codec entry is updated after the evaluations to indicate whether that codec and/or MNO is available for VoWiFi service.

After the processing of the monitoring section and the status section, the hub 17 is aware of whether a VoWiFi connection is supportable based on the current link conditions for an MNO/LTE cellular network 3. Furthermore, the hub also has information relating to which codecs are supported for VoWiFi and where multiple LTE network are available, the status of each LTE network with regards to VoWiFi.

Request Processing Section

The request processor section contains a VoWiFi request receiver 53 and a set of client profiles 55 relating to any devices which have requested VoWiFi. These components are linked to the VoWiFi service status processor 47.

In this embodiment, the hub is configured to identify VoWiFi requests from the VoWiFi capable devices 9 by looking for IP packet flows addressed to the IP address of the ePDG 25. The VoWiFi request processor 53 creates a rule with the packet routing function 37 so that when data packets are first issued from UEs 9 which have joined the WLAN are detected, they are intercepted by the VoWiFi request processor 53 so that the VoWiFi service availability can be determined before the packets are forwarded to the ePDG 25 to establish a VoWiFi connection. In this way, if a VoWiFi service is available, then there is only a slight delay in the link establishment, however, if the hub 17 knows that a VoWiFi service is not available, then the request is blocked and the UE 9 will time out and remain on VoLTE.

Having intercepted data packets indicative of a VoWiFi request, the VoWiFi request processor 53 notifies the VoWiFi service status processor 47 and the VoWiFi service status processor 47 creates a new profile entry 55 containing the address of the UE (source address from the data packet) and the address of the ePDG (packet destination address). The VoWiFi service status processor 47 identifies the MNO record corresponding to the ePDG address from the MNO store 49 and any codec records which are used by that LTE cellular network 3. The ready status fields for the MNO entry corresponding to the UE 9 and codec entry from the codec store 51 are checked and if the status of the MNO and at least one codec are "ready" then the VoWiFi service status processor will update the client profile 55 to show that the client 9 is connected to VoWiFi and cause the VoWiFi request processor 53 to instruct the packet routing function to forward the VoWiFi request to the ePDG 25. To avoid unnecessary overhead, the VoWiFi request processor 53 also adds an exception to the general packet routing function rule so that any further packets from the UE 9 to the ePDG do not need to be intercepted while the UE is still connected to the WLAN. In this way, normal VoWiFi data session packet flows are not impeded.

However, if the record in the MNO store 49 indicates that the VoWiFi service is not available due to the current line conditions being insufficient, then the VoWiFi service status processor 47 will update the client record 55 to indicate that VoWiFi has been requested but is not available. The VoWiFi request processor 53 then instructs the packet routing function 37 to drop the packet. When the UE 9 does not receive a response from the ePDG 25 it will assume that the VoWiFi service is not available and stay connected to VoLTE.

UE

Figure 3:
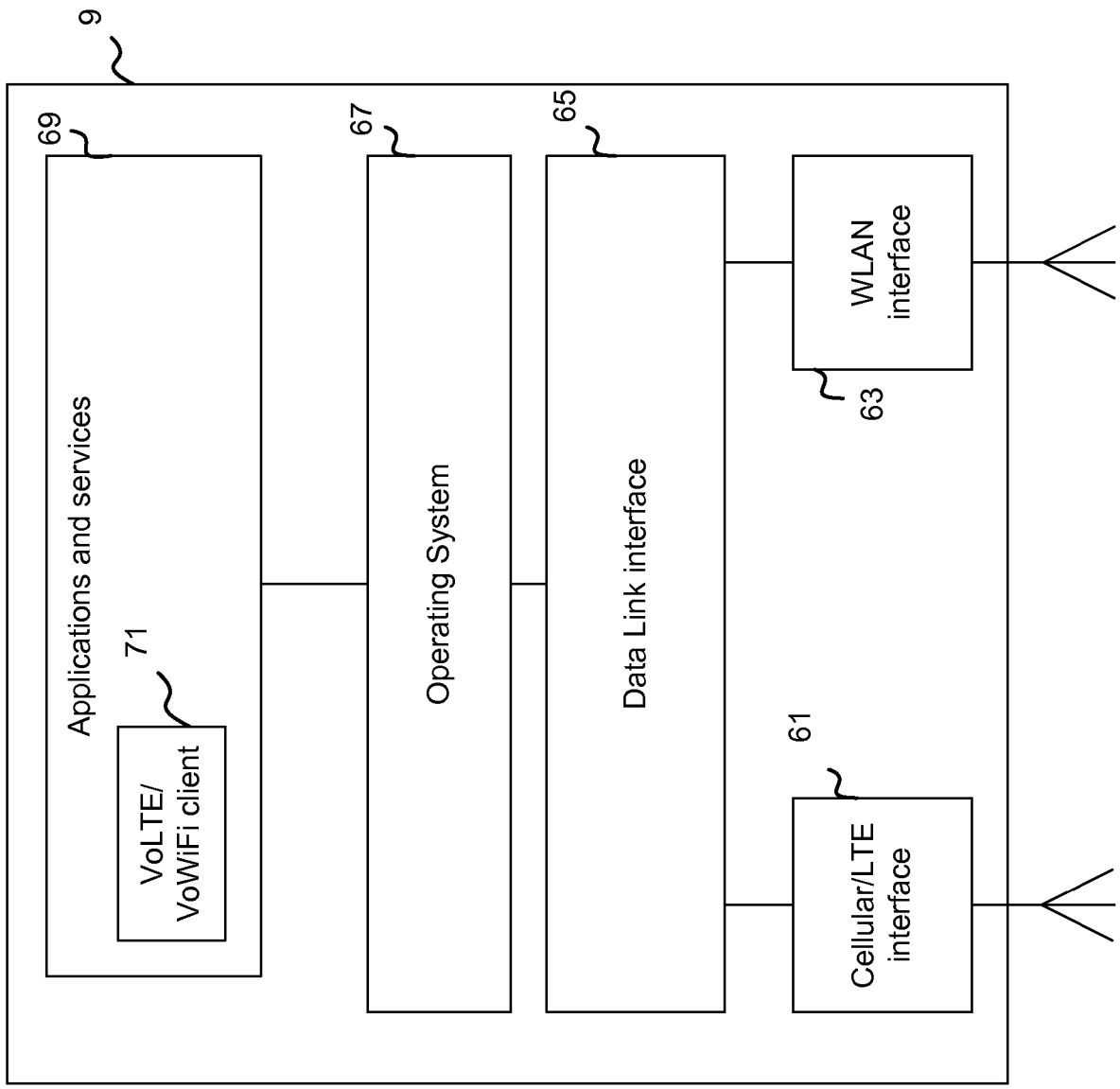
FIG. 3 schematically shows the components of a mobile device in accordance with the first embodiment.

The components of the UE 9 will now be described with reference to FIG. 3.

The UE 9 contains a cellular network interface 61 and a WLAN interface 63. The cellular interface 61 is compatible with the eNodeB 13 of the cellular network 3 and the WLAN interface 63 is compatible with the WLAN interface 31 of the hub 17.

Since either interface 61, 63, may be used by the UE 9, a data link interface 65 is responsible for enabling and disabling each interface 61, 63 as required and for routing user data and control packets to the interfaces 61, 63.

An operating system 67 is responsible for the overall operational tasks performed by the UE 9 and links a number of applications and services 69 to the data layer interface 65.

One of the applications within the applications and services 69 is a telephony application 71 which is compatible with VoLTE and VoWiFi.

In normal operation, the telephony application 61 is configured to connect to the MMTel service 15 provided in the IMS 7 to provide voice services via VoLTE and VoWiFi. The UE 9 registers for VoWiFi when it is connected to a WLAN 19 and the UE 9 registers for VoLTE when it is connected to the LTE cellular network 3.

If the response from the hub 17 is to allow VoWiFi registration, the VoWiFi capable UE 9 will try to switch from VoLTE to VoWiFi in a standard manner. As described above, the hub 17 processing will determine whether the current connection conditions can or cannot support such a VoWiFi connection from the UE 9 to the subscribed LTE cellular network 3 in a manner which is transparent to the UE 9. If the hub 17 processing described above denies VoWiFi access because the current line conditions are not sufficient to support VoWiFi, the UE 9 will conclude that the request has timed out, drop the VoWiFi registration request and remain connected to VoLTE for voice communications. However, in this embodiment the UE 9 will maintain the WLAN connection so that other data services continue to travel via the WLAN interface and only the VoLTE service uses the LTE cellular connection.

Although there may be a battery penalty from enabling two wireless data connections simultaneously, the benefit is that only the VoLTE service is using LTE and therefore there is no disruption caused by a switch of network adaptor to other data services that may be active on the UE. Furthermore, most cellular subscribers to an MNO have data usage limits on the LTE service and therefore a transparent switch of all data services to LTE when the user believes they are on a WLAN (which is generally unmetered) would be a negative user experience.

In this embodiment, if a UE is denied VoWiFi access by the hub, it is configured to re-try the registration at a later time, for example after 5 minutes.

The operation of the various components in the UE 9 and hub 17 will now be described with reference to flow charts shown in FIGS. 4 to 8.

Overall Flowchart

Figure 4:
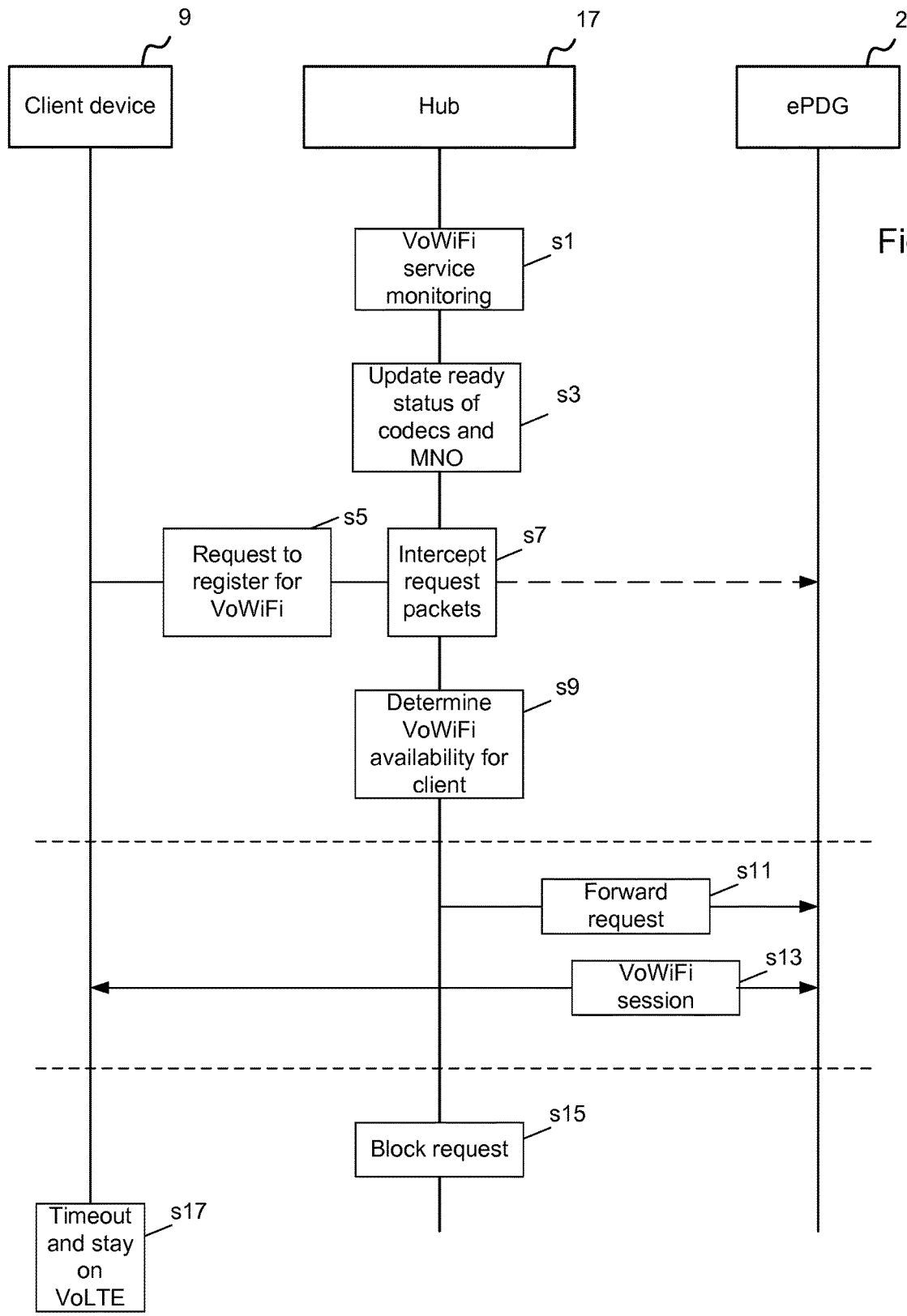
FIG. 4 schematically shows an overview of the interactions between a mobile device, hub and evolved packet data gateway (ePDG) in accordance with the first embodiment.

FIG. 4 shows an interaction flowchart of the processing carried out between the UE, hub and ePDG.

In s1, the monitoring sections of the VoWiFi service status processor record status information for the WLAN connection, WAN statistics and the performance of the logical link to the ePDG, In s3, the availability values for each of the MNOs and codecs is updated by comparing the criteria against the actual observed conditions.

Once this has been completed, the MNO stores and Codec stores described above will contain valid status information about the ability of the hub's connections to support a number of types of VoWiFi connection.

In s5, a request for VoWiFi is generated from the user and addressed to the ePDG 25.

In s7 the hub intercepts the request data packets and in s9 determines the ability of the network connections to support a VoWiFi request.

After the processing in s9, if the VoWiFi connection is possible, in s11, the request for VoWiFi from the UE 9 is forwarded to the ePDG and in s13 a VoWiFi session is established.

Alternatively, if after s9 the hub determines that VoWiFi is not supported (which may be down to a policy), then in step s15 the hub blocks forwarding of the packet to the ePDG 25 and in s17 the UE 9 determines that its request has times out and so abandons the VoWiFi request and stays on VoLTE.

FIG. 5 shows the processing by the VoWiFi service status processor 47 during the monitoring section.

As mentioned above, there are three interfaces measured by the monitoring components of the hub 17.

The WLAN interface monitor 41 is configured to monitor the WLAN interface 31 and determine the currently available throughput/capacity of the WLAN link 19.

The WAN interface monitor 43 is configured to monitor the WAN interface 35 and obtain line statistics for relating to the jitter, packet loss, etc. for the connection between the hub 17 and ISP 21.

The ePDG monitor 45 is configured to determine metrics relating to the link between the hub 17 and the ePDG 25.

Each of these monitors 41, 43, 45 is configured to continually monitor the metrics in order to be able to provide up-to-date information about the current state of the hub's connections.

In s21 the VoWiFi service status monitor 47 will retrieve the latest values and metrics from each of the monitors 41, 43, 45 in the hub 17.

In s23, a subset of the lowest values of the collected metrics is determined from the collected three sets of metric information. This step determines the maximum performance of the network link between the UE and the ePDG for VoWiFi as limited by the worst performing metric of, for example throughput, packet loss, jitter, delay etc.

In s25, the determined subset of metrics are compared against the stored codec and MNO requirements for each codec and MNO to determine which codecs are supported based on the current environment and which MNOs can support a new VoWiFi connection.

In s27, the results of the comparison are used to update the availability field of each codec and MNO. Processing then ends for this monitoring cycle. The monitoring process is repeated at regular intervals to maintain the validity of the monitoring data. In this embodiment the monitoring processing is repeated every 5 minutes to provide a balance between data validity and processing overhead.

FIG. 6 shows details of the comparison s25 in more detail for a single codec.

In s31, the codec requirements are retrieved from the codec store 51. The codec attributes indicate minimum thresholds which must be met to allow a voice stream to operate in accordance with the codec.

The MNO requirements are also retrieved from the MNO data store 49. The MNO requirements relate to known information about the configuration of the MNO and the codecs they prefer to use. A tolerance score is also stored which dictates whether a VoWiFi connection should be allowed even if the current line conditions don't satisfy the normal thresholds. The tolerance is therefore a modifier of the quality criteria and the tolerance can vary throughout the day in accordance with expected network load etc.

In s33, the subset of the current link conditions generated in step s23 is compared against each of the modified codec requirements.

In s35, a test is performed to determine whether the current line conditions can support the codec requirements.

If the current conditions can support the codec requirements, then in s37 the entry for that codec and MNO is updated to indicate that the MNO will accept requests for VoWiFi from a device. Alternatively, if the current conditions are determined to be unable to support VoWiFi, then in s39 the records in the MNO store are updated to indicate that the codec is not currently supported.

The above processing, is repeated for each known codec which can be used for VoWiFi. After the processing to compare codecs is complete, then processing returns to s27 in FIG. 5.

The processing of the monitoring section of the VoWiFi service status processor 47 to determine when VoWiFi connections are possible is performed periodically so that the current status of the VoWiFi connection is always available when UEs request a connection to their ePDG.

Figure 7:
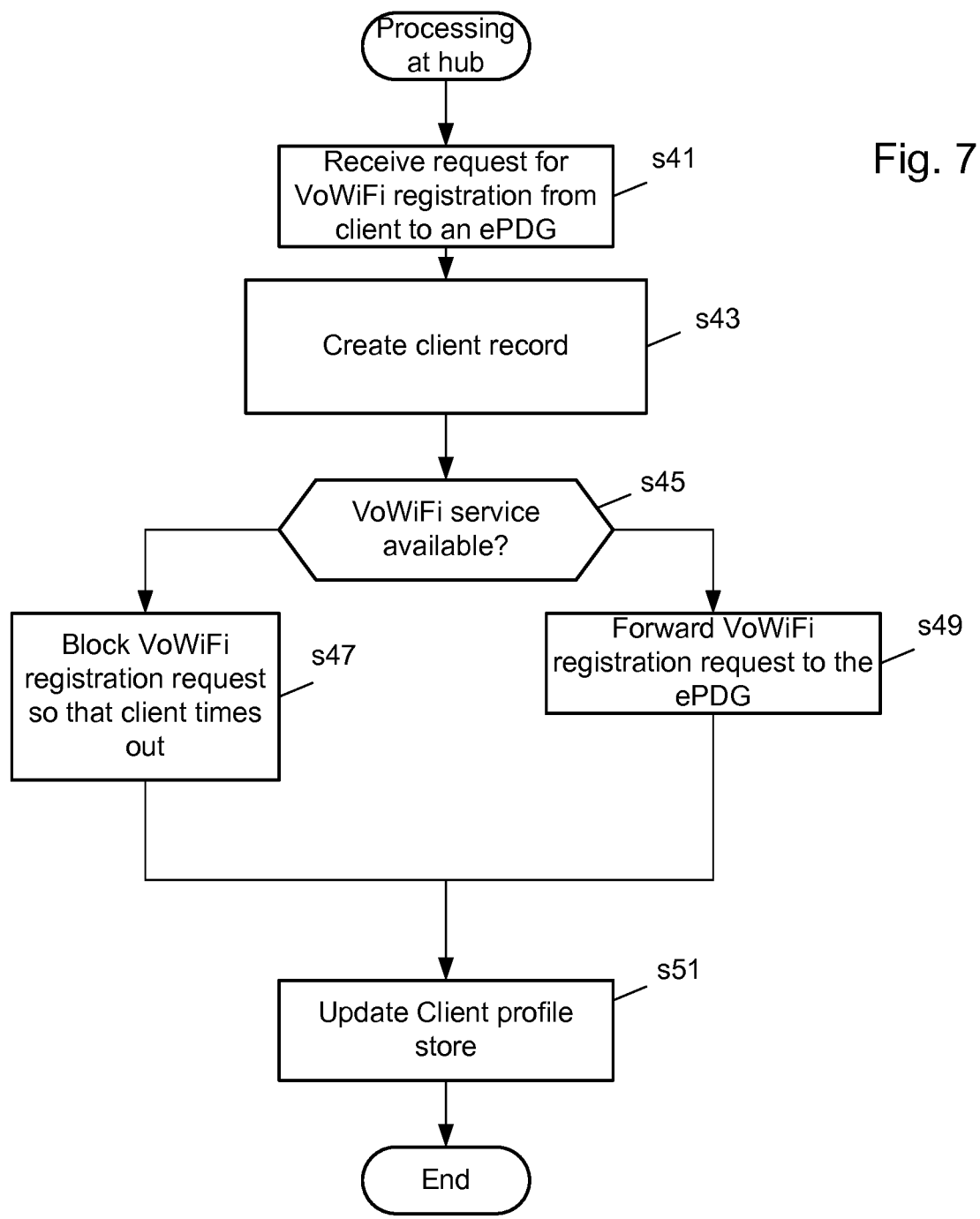
FIG. 7 is a flowchart showing the operation of the hub when it receives a request for VoWiFi connection.

FIG. 7 is a flowchart showing the processing carried out by the VoWiFi service status processor when a UE 9 wishes to connect to an ePDG 25.

In s41, the VoWiFI request receiver 53 receives a request for VoWiFi from one of the UEs 9 connected to the WLAN. In this embodiment, the VoWiFi request receiver is configured to intercept such requests from data packets sent by a UE 9 and addressed to a known eDPG's IP address.

Once a request has been received, a new client profile 55 is generated for the UE 9.

In s45, a test is carried out to determine whether the requested VoWiFi connection is allowed. With the earlier processing to monitor the state of the VoWiFi connection, this process is fairly simple because it only involves identifying the UE's MNO and then reading the MNO status information in the MNO store 49.

If the status indicates that the VoWiFi service would not be available for that client, then in s47 the request is blocked so that the client will time out and remain on VoLTE.

If the test is successful and the requested VoWiFi service is available, then in s49, the VoWiFi request is forwarded to the ePDG.

In s51, the client profile 55 is updated with details of the client and the status of its VoWiFi request and processing ends.

In the first embodiment, a hub is modified to regularly monitor the status of WLAN, WAN and ePDG data links to determine whether the current connections are sufficient to support VoWiFI services. When a device 9 connects to the WLAN of the hub and attempts to switch from its VoLTE service to VoWiFi via the hub 17, the hub 17 is configured to determine whether the current conditions can satisfy a VoWiFi connection. If the VoWiFi service can support the connection, the request is routed to the ePDG 25 associated with the mobile device's MNO. However, if the current conditions cannot satisfactorily support a VoWiFi connection such that incoming calls may be missed or the quality of active calls would not be clear, then the hub 17 is configured to block the request so that the UE 9 will time out and remain connected to VoLTE.

In the embodiment, the hub is configured to monitor the status of the link to a single ePDG in addition to the local WLAN and WAN connections. The skilled person will appreciate that UEs 9 belonging to subscribers of a number of different LTE networks 3 may be connected to the WLAN and therefore the ePDG link status monitoring must be carried out for each of the possible LTE networks. For efficiency, an administrator for the home network may define a list of the LTE networks required so that the hub does not perform processing for unused networks.

Alternatives and Modifications

In the embodiment, the connection between the hub and an ISP is provided by a DSL link. In an alternative where the ISP hardware is based on Data Over Cable Service Interface Specification (DOCSIS), the WAN interface 35 is a cable modem compliant with the DOCSIS cable standards.

In the embodiment, the administrator for the hub defines the set of ePDGs which should be monitored. In an alternative, the hub can be configured to perform the ePDG monitoring "on-demand" whereby it is provided with a list of the available ePDG IP addresses and the ePDG monitor will only start monitoring any particular ePDG when a UE 9 tries to connect to that ePDG.

In a further alternative, given the large number of possible ePDGs, an external ePDG monitor performs the checks on the availability of the ePDGs and the hub only needs to contact the external ePDG monitor with the identity of the requested ePDG.

In a simpler alternative, the hub only monitors the WLAN and WAN interface status and does not obtain status information for the ePDG connection.

In the embodiment the availability of the VoWiFi service provided by the LTE network is constantly determined so that the operation of the hub in response to a detected request for VoWiFi is rapid. However this can result in wasted processing when there are no devices using the VoWiFi service.

In an alternative, the hub is configured to disable the monitoring and VoWiFi service status determination when there are no devices connected to the WLAN or after a predetermined period of time without any requests for VoWiFi.

In a further alternative, the hub does not perform any monitoring in advance of a VoWiFi request and only checks the WLAN, WAN and ePDG link in response to the VoWiFi service request. This saves idle processing of the hub at the expense of a longer delay when a VoWiFi request is received.

In the embodiment, the hub is configured to intercept VoWiFi handover requests from UEs. In this way the operation of the hub is transparent to the UEs and the ePDGs. If the conditions are sufficient the UE's VoWiFi request is passed through to the ePDG and it the conditions are not, then the VoWiFi request is blocked by the hub and the UE will time out and assume the service is not available. In an alternative, the operation of the UEs is modified so that their requests for VoWiFi are actually addressed to the hub and the hub actively carries out the management of VoWiFi connections to the respective ePDG. This alternative requires modifications to the VoWiFi clients to address their requests to the hub and not the ePDG directly, but simplifies the hubs since they do not need to perform packet inspection to intercept the VoWiFi request packets from UEs.

In the embodiment, the hub will block a UE request for VoWiFi if the current link conditions cannot satisfy a VoWiFi session. The UE is not aware of the hub's role in blocking the request and therefore assumes that the VoWiFi service is not available and so remains connected to VoLTE for voice services. In a modification, at a later point in time when the hub determines that the VoWiFi services would now be available, the hub notifies previously blocked UEs, identified from the records in the client profiles, that they can registered for VoWiFi.

The invention claimed is:

1. A method of operating a wireless local area network (WLAN) access point device, located at a user premises, to control access by at least one mobile device to a voice service provided by a cellular network and accessible via a cellular network gateway located at a logical edge of the cellular network and connected to a wide area network, the WLAN access point having a WLAN interface for communication with the at least one mobile device via a WLAN wireless link, and a wide area network interface for communication with the cellular network gateway and the wide area network via a wide area network link, and the at least one mobile device having a non-cellular WLAN interface for communication with the WLAN access point and a cellular network interface, the method being performed by the WLAN access point device and comprising:

determining whether current network conditions on at least the WLAN wireless link, the wide area network link and a data path to the cellular network gateway can support a predetermined set of voice service requirements by:

determining performance metrics for the WLAN wireless link and performance metrics for the wide area network link, establishing a communication link to the cellular network gateway and determining performance metrics for the established communication link, comparing a subset of the determined performance metrics against a set of thresholds required for the voice service, wherein the thresholds correspond to minimum performance requirements for at least one voice codec used by the voice service, accessing cellular network information including a modifier value for the minimum performance requirements and modifying the set of thresholds in accordance with the modifier value, receiving a request from the at least one mobile device to the cellular gateway for the voice service, and if the determination is that the voice service can be supported by the current network conditions to the cellular network gateway, allowing a connection to the voice service to be established by the at least one mobile device;

if the determination is that the voice service cannot be supported by the current network conditions, blocking the voice service request so that in response to the blocking, the at least one mobile device will connect to the voice service via the cellular network interface and the cellular network.

2. The method according to claim 1, wherein the subset of determined performance metrics is a selection of lowest performance metrics.

3. The method according to claim 1, wherein the at least one mobile device is configured to access a Voice over Wi-Fi (VoWiFi) voice service via the wireless access point and the cellular gateway device, and further configured to access a Voice over LTE (VoLTE) voice service via the cellular network.

4. An apparatus for controlling access of at least one mobile device to a voice service provided by a cellular network and accessible via a cellular network gateway located at a logical edge of the cellular network and connected to a wide area network, the at least one mobile device having a non-cellular wireless local area network (WLAN) interface for communication with a WLAN access point and a cellular network interface, the apparatus comprising:

a WLAN interface for communication with the at least one mobile device via a WLAN wireless link;

a wide area network interface for communication with the cellular network gateway and the wide area network via a wide area network link;

a processor for determining whether current network conditions on at least the WLAN wireless link, the wide area network link and a data path to the cellular network gateway can support a predetermined set of voice service requirements by:

determining performance metrics for the WLAN wireless link and performance metrics for the wide area network link, establishing a communication link to the cellular network gateway and determining performance metrics for the established communication link, comparing a subset of the determined performance metrics against a set of thresholds required for the voice service wherein the thresholds correspond to minimum performance requirements for at least one voice codec used by the voice service, and accessing cellular network information including a modifier value for the minimum performance requirements and modifying the set of thresholds in accordance with the modifier value;

a receiver for receiving a request from the at least one mobile device to the cellular network gateway for the voice service; and the processor further being operable to:

allow a connection to the voice service to be established by the at least one mobile device if the determination is that the voice service can be supported by the current network conditions; and block the voice service request if the determination is that the voice service cannot be supported by the current network conditions, so that in response to the block, the at least one mobile device will connect to the voice service via the cellular network interface and cellular network.

5. The apparatus according to claim 4, wherein the subset of determined performance metrics is a selection of lowest performance metrics.

6. The apparatus according to claim 4, wherein the at least one mobile device is configured to access a Voice over Wi-Fi (VoWiFi) voice service via the wireless access point and the cellular gateway device, and further configured to access a Voice over LTE (VoLTE) voice service via the cellular network.

7. A non-transitory computer-readable storage medium storing a computer program containing processor executable instructions for causing a processor to carry out the method of claim 1.

* * * * *